United States Patent [19]
Park et al.

[11] Patent Number: 5,519,232
[45] Date of Patent: May 21, 1996

[54] QUANTUM INTERFERENCE DEVICE

[75] Inventors: Kyoung-Wan Park, Daejeon; Seong-Jae Lee, Seoul; Min-Cheol Shin, Daejeon, all of Rep. of Korea

[73] Assignee: Electronics and Telecommunications Research Institute, Daejeon, Rep. of Korea

[21] Appl. No.: 352,046

[22] Filed: Nov. 30, 1994

[30] Foreign Application Priority Data

Sep. 16, 1994 [KR] Rep. of Korea .................. 94-23653

[51] Int. Cl.⁶ .................. H01L 31/0328; H01L 31/0336
[52] U.S. Cl. .................................. 257/192; 257/194
[58] Field of Search .................................. 257/192, 194, 257/20, 24, 27, 29

[56] References Cited

U.S. PATENT DOCUMENTS

| | | | |
|---|---|---|---|
| 4,559,547 | 12/1985 | Shiraki et al. | 257/194 |
| 4,796,068 | 1/1989 | Katayama et al. | 257/20 |
| 4,806,998 | 2/1989 | Vinter et al. | 257/192 |
| 5,130,763 | 7/1992 | Delhaye et al. | 257/192 |

FOREIGN PATENT DOCUMENTS 255416A 2/1988 European Pat. Off. .

OTHER PUBLICATIONS de Vegvar et al, "Tunable Aharonov–Bohm effect in an electron interferometer". 50 Rapid Communications 3491 (Aug. 15, 1989).
Tokura et al, "Conductivity oscillation due to quantum interference in a proposed wash–board transistor", 22 Appl. Phys. Lett 1807 (Nov. 30, 1987).
Allee et al, "Engineering lateral quantum interference devices using electron beam lithography and molecular beam epitaxy", B7(6) Nov./Dec. 1989, J. Vac. Sci, Tech.

*Primary Examiner*—Wael M. Fahmy
*Attorney, Agent, or Firm*—Larson and Taylor

[57] ABSTRACT

A quantum interference device comprises a semi-insulating GaAs substrate; GaAs and AlGaAs layers sequentially formed with high purity on the substrate; a two-dimensional electron gas layer formed in the GaAs layer and serving as a channel; source/drain regions formed on the semi-insulating GaAs substrate and at both ends of a laminated portion composed of the GaAs/AlGaAs layers; and a gate formed on the AlGaAs layer and having a periodic structure wherein the length thereof varies in a periodic manner in a transverse direction. In the device, the electron gas layer formed in the GaAs layer is used as an electron path, and the phases of electrons passing along different electron paths are caused to interfere with each other by the gate, thereby causing the current of a drain therein to be maximized or minimized. The transconductance can be significantly increased.

2 Claims, 3 Drawing Sheets

QUANTUM INTERFERENCE DEVICE

BACKGROUND OF THE INVENTION

1. Field of the Invention

The present invention relates to a quantum interference device utilizing an interference phenomenon of electrons, and more particularly to a quantum interference transistor using a phase difference of electronic waves caused by a corrugated or periodic length structure of a gate capable of controlling a current amount flowing between a source and a drain thereof.

2. Description of the Prior Art

Wave nature of electron means that electrons are moved like a wave. Particularly, interference of electron means that, when two electronic waves passing through different paths meet again at the same position to add the waves to each other, the intensity of the resultant wave added thus is changed dependent upon a difference between the two different paths. In detail, it means that electron has a phase as a wave, and, if electrons having a different phase are moved in the same direction, the elections are interfered with one another, thereby causing totally flowing intensity of electrons, i.e. a current intensity to be changed.

These phenomena can be described by a quantum mechanics, and a transistor utilizing these phenomena is called "a quantum interference transistor".

This quantum interference transistor has the same transistor functions as a conventional semiconductor transistor, in which phases of electrons in channel thereof are, however, adjusted by a gate voltage, thereby allowing a drain current thereof to be controlled. Also, it has an operation characteristics of a high speed because of utilizing a ballistic movement.

In this quantum interference transistor, however, since the interference occurring in a solid state vanishes away by an inelastic collision of electrons and physical and material factors, to reduce such an inelastic collision is required so as to obtain operation of a transistor capable of being performed by a quantum dynamic interference, or to reduce the size of such a quantum interference transistor is required in order that electrons are interfered with one another prior to inelastic collision. The physical factor indicates phonon or the like and the material one does impurities, grain boundary or the like.

With the progress of a technique for growing crystal material of a high purity such as molecular beam epitaxy(MBE), metal organic chemical vapor deposition or the like, factors serving as inelastic collision in a thin film can be largely lowered. It also is possible to form a fine pattern using electron beam lithography progresses. Therefore, several types of quantum interference devices utilizing interference of electron have developed in recent years, typical one of which is a quantum interference transistor having a parallel-gate structure and is disclosed in Applied Physics Letters by D. R. Allee, etc. "Engineering lateral quantum interference devices using electron beam lithography and molecular beam epitaxy", pp 2015–2019 in 1989 American Journal of Vacuum Science & Technology.

FIG. 4 shows the construction of the disclosed quantum interference device having a parallel-gate structure. With reference to FIG. 4, the device is fabricated on a semi-insulating substrate with MBE(molecular beam epitaxy) layers grown at 580° C. In detail, a GaAs layer having 40 nm in thickness is first grown followed by eight periods of an AlGaAs/GaAs superlattice. A buffer layer having 500 nm in thickness is then grown, followed by an undoped AlGaAs spacer layer having 2.5 nm in thickness, an AlGaAs layer doped with Si at $2 \times 10^{18}$ cm$^{-3}$, and finally an n$^+$GaAs cap layer. The sheet resistance for this wafer was 250 $\Omega$/sq. The thicker spacer layer increases the electron mobility in the heterojunction interface by reducing the Coulombic scattering. The cap layer also is so thin that the gate electrodes can be places directly on top avoiding the wide gate recess and simplifying the fabrication sequence.

However, in the prior art quantum interference transistor, since two gate electrodes are formed in parallel on the AlGaAs layer and all a source, a drain, and an electron path between them are composed of a two dimensional electron gas, such a quantum interference transistor uses the resonant tunneling effect and/or multiple reflection effect of the electron wave. Further, a high gate voltage is required therein to form a well-shaped potential well or barrier. As compared the quantum interference device to a semiconductor device having the same size as the interference device, the interference device has a number of channels and interference of electron is seriously lowered due to averaging of the number of channels. It is therefore difficult to use commonly.

SUMMARY OF THE INVENTION

It is an object of the present invention to provide a quantum interference device in which a transconductance thereof can be increased in accordance with a corrugated or periodic length structure of a gate capable of controlling a phase of electron.

According to the aspect of the present invention, the quantum interference device comprising a semi-insulating GaAs substrate; GaAs and AlGaAs layers sequentially formed with high purity on the substrate; a two-dimensional electron gas layer, formed in the GaAs layer, for serving as a channel; source/drain regions formed on the semi-insulating GaAs substrate and at both ends of a laminated portion composed of the GaAs/AlGaAs layers; and a gate formed on the AlGaAs layer and provided with a periodic length structure in a transverse direction.

In this device, the periodic length structure comprises a plurality of unit portions which are extended in the transverse direction of the gate, each of which has a first plate having a length $W_1$ and a second plate having a length $W_2$, and the length $W_1$ is longer than the length $W_2$.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENT(S)

Figure 1:
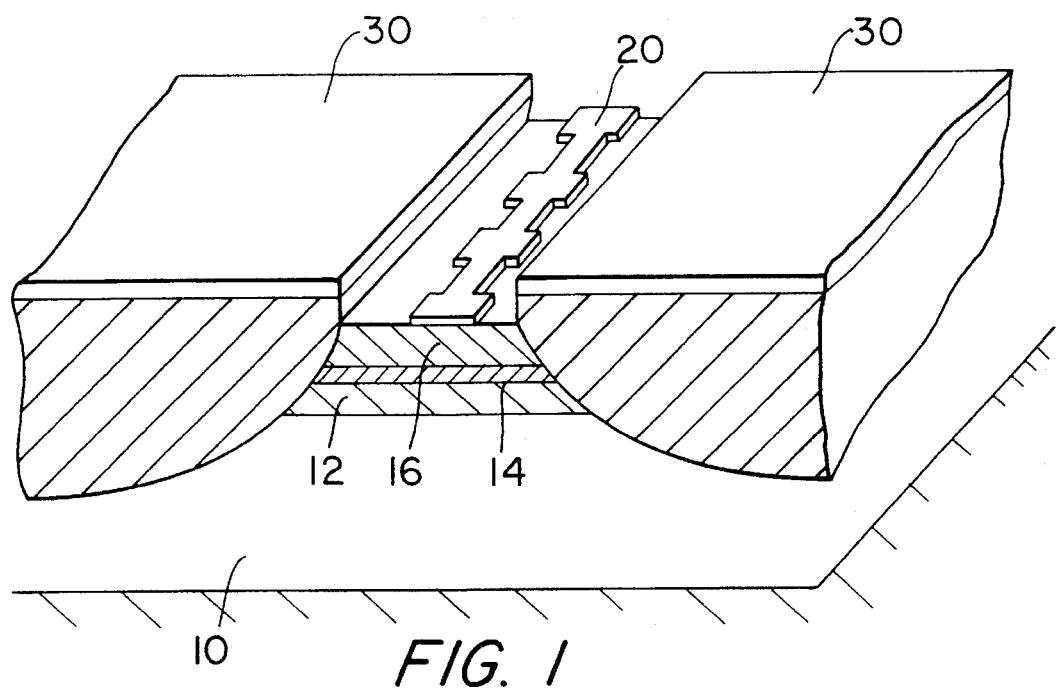
FIG. 1 is a perspective view showing the construction of a quantum interference transistor according to the present invention.

Referring to FIG. 1, the quantum interference transistor (hereinafter, referred to as "QIT") according to the present invention comprises a semi-insulating GaAs substrate 10, GaAs and AlGaAs layers 12 and 16 which are sequentially formed with high purity on the substrate 10, and a two-dimensional electron gas layer 14 which is formed in the GaAs layer 12. In this QIT, the electron gas layer 14 functions as a channel thereof, i.e. an electron path. Also, the QIT further comprises source/drain regions 30 which are formed on the semi-insulating GaAs substrate 10 and at both ends of a laminated portion of the GaAs/AlGaAs layers 12, 16. The source/drain regions 30 are electrically isolated from each other. On the AlGaAs layer 16 a gate 20 is formed, which has a corrugated or periodic length structure in a transverse direction thereof.

In the QIT construction, phases of electrons which are formed in close order in the two-dimensional electron gas layer are controlled by the gate 20 located between the source/drain regions 30. The distance between the source/drain regions 30 is not more than the interference length of electrons, and totally flowing intensity of electrons, i.e. intensity of electric current, is determined by an electric potential of the gate 20. The electric potential of the gate 20 to be sensible to the phase of the electrons is dependent upon the periodic width structure of the gate 20.

In details, the gate 20 is periodically formed in length in the transverse direction in order that the electrons are interfered by phase difference of each other.

Figure 2:
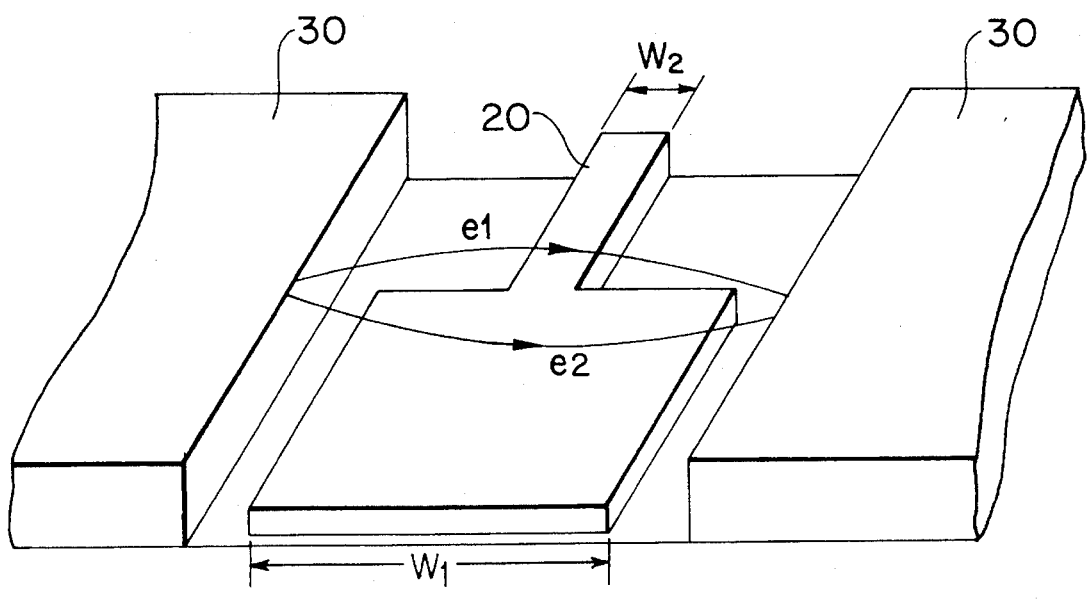
FIG. 2 is an enlarged view of a portion of the gate in the quantum interference transistor shown in FIG. 1.

FIG. 2 is an enlarged view of a portion of the gate 20 in the QIT shown in FIG. 1.

The periodic length structure of the gate 20 comprises a plurality of unit portions which extend in the transverse direction, each of which has a first plate having a length $W_1$ and a second plate having a length $W_2$, as shown in FIG. 2. In this structure, the length $W_1$ is greater than the length $W_2$. Electrons flow through two paths e1 and e2, as shown in FIG. 2. The first path e1 also is formed under the first plate and the second path e2 is formed under the second plate.

Wave length of each electron is decided by a wave length of electron having a Fermi energy, and the wave length $\lambda$ is importantly concerned with electron density as given in following equation (1):

$$\lambda = (2\pi/n)^{1/2} \quad (1)$$

where n represents electron density and is determined by a voltage of the gate 20.

When a voltage is applied to the gate 20, flowing electrons in the gas layer 14 are different in phase in accordance with the two paths e1, e2 between the source/drain regions 30.

Between the two paths, a phase difference of electrons is given in following equation (2):

$$\Delta\phi = (2\pi/\lambda_2 - 2\pi/\lambda_1) \times L \quad (2)$$

where $\lambda_1$ and $\lambda_2$ are wave length of a portion in which a gate is formed and wave length of a portion in which a gate is not formed, respectively, and L represents a path difference of the gate (the length, $L = W_1 - W_2$). $\lambda_1$ is determined by a voltage of the gate and $\lambda_2$ is determined by a fabrication condition of AlGaAs/GaAs.

In the gate structure of the present invention, when electrons pass through the gas layer 14 under unit portions of the gate not to be adjacent with each other, the interference caused by these electrons being small enough to be neglected, because the distance of the path is more longer than the interference length of electrons. As a result, the phase difference can be closely to the equation (2).

In the QIT of the present invention, the phase of electron passing along first path e1 can be changed more than that of electron passing along second path e2 under a gate voltage and thereby a quantum interference of electron can be easily controlled in accordance with the gate voltage.

If the phase difference is $2n\pi$ in the equation (2) and n is an integer, the phases of electrons are constructively interfered with each other, thereby causing the current between the source/drain thereof to be maximized.

On the other hand, if $\Delta\phi$ is $(2n+1)\pi$ in the equation (2) and n is an integer, the phases of electrons are offset with each other, thereby causing the current therebetween to be minimized.

Figure 3:
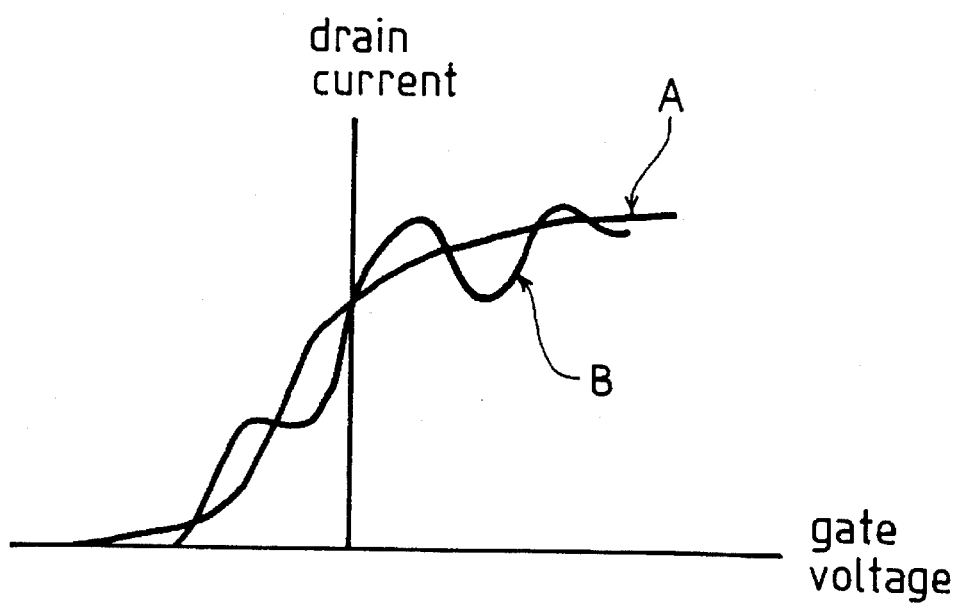
FIG. 3 is a graph diagram showing a relation between a drain current and a gate voltage so as to compare characteristic of the quantum interference transistor according to the present invention with that of a prior art transistor.
Figure 4:
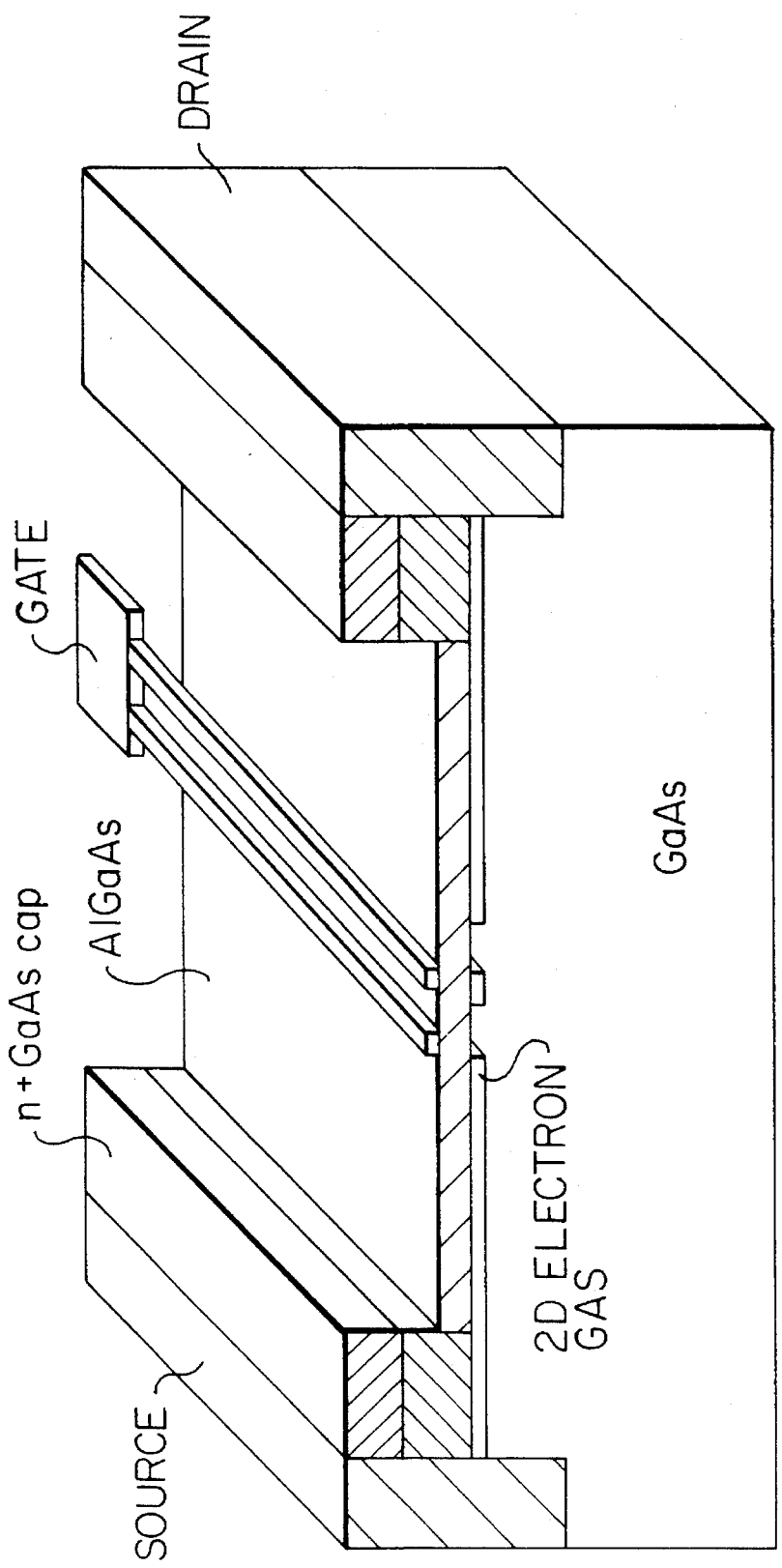
FIG. 4 is a perspective view showing the construction of a prior art quantum interference transistor.

With reference to FIG. 3, the reference symbol "B" is a curve indicating the characteristics of the QIT according to the present invention, and the reference symbol "A" is a curve indicating the characteristics of the prior art transistor.

As seen in FIG. 3, the transistor of the present invention has relatively high transconductance, as compared to the prior art QIT.

In the QIT according to the present invention as described above, a two-dimensional electron gas layer formed in GaAs is used as an electron path, and the phases of electrons passing along electron path is interfered with each other by a gate having periodical length, thereby causing the current of a drain therein to be maximized or minimized. Therefore, the transconductance of the QIT can be relatively increased as compared to the prior art transistor.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A quantum interference device comprising:

a semi-insulating GaAs substrate:

a GaAs layer and an AlGaAs layer sequentially formed with high purity on the substrate:

a two-dimensional electron gas layer formed in the GaAs layer and serving as a channel;

source/drain regions formed in the semi-insulating GaAs substrate and at both ends of a laminated portion composed of the GaAs and AlGaAs layers; and a gate formed on the AlGaAs layer and having a length measured in the source/drain direction between said source/drain regions at said both ends of said laminated portion, said gate comprising a periodic structure wherein said length of said gate varies in a periodic manner in a direction transverse to said source/drain direction so as to provide quantum interference between electrons traveling across portions of said gate of different lengths.

2. The quantum interference device as defined in claim 1, wherein the periodic structure comprises a plurality of unit portions which extend in the transverse direction of the device, each of said unit portions comprising a first plate having a length $W_1$ and a second plate having a length $W_2$, and the length $W_1$ is greater than the length $W_2$.

* * * * *